(12) United States Patent
Kuan et al.

(10) Patent No.: US 7,985,628 B2
(45) Date of Patent: Jul. 26, 2011

(54) INTEGRATED CIRCUIT PACKAGE SYSTEM WITH INTERCONNECT LOCK

(75) Inventors: Heap Hoe Kuan, Singapore (SG); Seng Guan Chow, Singapore (SG); Linda Pei Ee Chua, Singapore (SG); Dioscoro A. Merilo, Singapore (SG)

(73) Assignee: Stats Chippac Ltd., Singapore (SG)

( * ) Notice: Subject to any disclaimer, the term of this patent is extended or adjusted under 35 U.S.C. 154(b) by 96 days.

(21) Appl. No.: 11/954,607

(22) Filed: Dec. 12, 2007

(65) Prior Publication Data
US 2009/0152706 A1 Jun. 18, 2009

(51) Int. Cl.
*H01L 21/332* (2006.01)

(52) U.S. Cl. ......... 438/124; 438/55; 438/109; 438/112; 438/125; 438/127; 257/433; 257/787; 257/790; 257/E33.057; 257/E33.059

(58) Field of Classification Search ............ 438/51, 438/55, 106, 109, 112, 124, 125, 126, 127, 438/FOR. 371, FOR. 375, FOR. 379; 257/433, 257/787, 790, E33.056, E33.057, E33.058, 257/E33.059, E23.116, E23.125
See application file for complete search history.

(56) References Cited

U.S. PATENT DOCUMENTS

| | | | |
|---|---|---|---|
| 5,333,505 A | 8/1994 | Takahashi et al. | |
| 5,373,189 A | 12/1994 | Massit et al. | |
| 5,950,070 A | 9/1999 | Razon et al. | |
| 6,043,109 A | 3/2000 | Yang et al. | |
| 6,239,496 B1 | 5/2001 | Asada | |
| 6,252,308 B1 | 6/2001 | Akram et al. | |
| 6,268,654 B1 | 7/2001 | Glenn et al. | |
| 6,291,884 B1 | 9/2001 | Glenn et al. | |
| 6,340,846 B1 | 1/2002 | LoBianco et al. | |
| 6,401,545 B1 | 6/2002 | Monk et al. | |
| 6,492,726 B1 * | 12/2002 | Quek et al. | 257/723 |
| 6,653,723 B2 | 11/2003 | Manansala | |
| 6,727,579 B1 | 4/2004 | Eldridge et al. | |
| 6,730,543 B2 * | 5/2004 | Akram | 438/109 |
| 6,861,288 B2 | 3/2005 | Shim et al. | |
| 6,962,282 B2 | 11/2005 | Manansala | |
| 6,995,448 B2 | 2/2006 | Lee et al. | |
| 7,026,709 B2 | 4/2006 | Tsai et al. | |
| 7,026,710 B2 | 4/2006 | Coyle et al. | |
| 7,031,500 B1 | 4/2006 | Shinohara | |
| 7,138,706 B2 | 11/2006 | Arai et al. | |
| 7,187,067 B2 | 3/2007 | Weng et al. | |
| 7,227,253 B2 | 6/2007 | Tsai et al. | |
| 7,245,008 B2 | 7/2007 | Lee | |
| 7,276,393 B2 | 10/2007 | Derderian et al. | |
| 7,288,835 B2 | 10/2007 | Yim et al. | |
| 7,298,033 B2 | 11/2007 | Yoo | |
| 7,309,913 B2 | 12/2007 | Shim et al. | |
| 7,391,105 B2 | 6/2008 | Yeom | |
| 7,468,556 B2 | 12/2008 | Logan et al. | |
| 7,504,284 B2 | 3/2009 | Ye et al. | |
| 7,521,790 B2 | 4/2009 | Tanida et al. | |
| 7,535,086 B2 | 5/2009 | Merilo et al. | |
| 7,557,443 B2 | 7/2009 | Ye et al. | |

(Continued)

*Primary Examiner* — N Drew Richards
*Assistant Examiner* — Joannie A Garcia
(74) *Attorney, Agent, or Firm* — Mikio Ishimaru

(57) ABSTRACT

An integrated circuit package system includes: mounting a device structure over a package carrier; connecting an internal interconnect between the device structure and the package carrier; forming an interconnect lock over the internal interconnect over the device structure with interconnect lock exposing the device structure; and forming a package encapsulation adjacent to the interconnect lock and over the package carrier.

20 Claims, 3 Drawing Sheets

U.S. PATENT DOCUMENTS

| | | |
|---|---|---|
| 7,589,408 B2 | 9/2009 | Weng et al. |
| 2002/0030261 A1 | 3/2002 | Rolda, Jr. et al. |
| 2004/0106229 A1 | 6/2004 | Jiang et al. |
| 2005/0253241 A1 | 11/2005 | Hall |
| 2006/0014328 A1 | 1/2006 | Shimonaka et al. |
| 2006/0076690 A1 | 4/2006 | Khandros et al. |
| 2006/0220256 A1 | 10/2006 | Shim et al. |
| 2006/0244157 A1 | 11/2006 | Carson |
| 2006/0256525 A1 | 11/2006 | Shim et al. |
| 2007/0108581 A1 | 5/2007 | Shim et al. |
| 2007/0181990 A1 | 8/2007 | Huang et al. |
| 2007/0190690 A1 | 8/2007 | Chow et al. |
| 2007/0216010 A1 | 9/2007 | Yim et al. |
| 2007/0246815 A1 | 10/2007 | Lu et al. |
| 2007/0278696 A1 | 12/2007 | Lu et al. |
| 2008/0157325 A1 | 7/2008 | Chow et al. |
| 2009/0085178 A1 | 4/2009 | Ha et al. |
| 2009/0152692 A1 | 6/2009 | Chow et al. |
| 2009/0152700 A1 | 6/2009 | Kuan et al. |
| 2009/0155960 A1 | 6/2009 | Chow et al. |

* cited by examiner

INTEGRATED CIRCUIT PACKAGE SYSTEM WITH INTERCONNECT LOCK

CROSS-REFERENCE TO RELATED APPLICATIONS

The present application contains subject matter related to concurrently filed U.S. patent application Ser. No. 11/954,601. The related application is assigned to STATS ChipPAC Ltd.

The present application also contains subject matter related to concurrently filed U.S. patent application Ser. No. 11/954,613. The related application is assigned to STATS ChipPAC Ltd.

The present application further contains subject matter related to concurrently filed U.S. patent application Ser. No. 11/954,603. The related application is assigned to STATS ChipPAC Ltd.

TECHNICAL FIELD

The present invention relates generally to an integrated circuit package system and more particularly to an encapsulated integrated circuit package system.

BACKGROUND ART

In order to interface an integrated circuit with other circuitry, it is common to mount it on a lead frame or substrate. Each integrated circuit has bonding pads that are individually connected to the substrate's contact or terminal pads using extremely fine gold or aluminum wires or conductive balls, such as solder balls. The assemblies are then packaged by individually encapsulating them in molded plastic or ceramic bodies to create an integrated circuit package.

Integrated circuit packaging technology has seen an increase in the number of integrated circuits mounted on a single circuit board or substrate. The new packaging designs are more compact form factors, such as the physical size and shape of a packaged integrated circuit, and providing a significant increase in overall integrated circuit density.

However, integrated circuit density continues to be limited by the "real estate" available for mounting individual integrated circuits on a substrate. Even larger form factor systems, such as personal computers (PC's), compute servers, and storage servers, need more integrated circuits in the same or smaller "real estate". Particularly acute, the needs for portable personal electronics, such as cell phones, digital cameras, music players, personal digital assistants (PDA's), and location-based devices, have further driven the need for increased integrated circuit density.

This increased integrated circuit density has led to the development of multi-chip packages in which more than one integrated circuit can be packaged. Each package provides mechanical support for the individual integrated circuits and one or more layers of interconnect lines that enable the integrated circuits to be connected electrically to surrounding circuitry.

Current multi-chip packages, also commonly referred to as multi-chip modules, typically consist of a printed circuit board (PCB) substrate onto which a set of separate integrated circuit components are directly attached. Such multi-chip packages have been found to increase integrated circuit density and miniaturization, improve signal propagation speed, reduce overall integrated circuit size and weight, improve performance, and lower costs—all primary goals of the computer industry.

Multi-chip packages whether vertically or horizontally arranged, can also present problems because they usually must be pre-assembled before the integrated circuit and integrated circuit connections can be tested. Thus, when integrated circuits are mounted and connected in a multi-chip module, individual integrated circuits and connections cannot be tested individually, and it is not possible to identify known-good-die ("KGD") before being assembled into larger circuits. Consequently, conventional multi-chip packages lead to assembly process yield problems. This fabrication process, which does not identify KGD, is therefore less reliable and more prone to assembly defects.

Moreover, vertically stacked integrated circuits in typical multi-chip packages can present problems beyond those of horizontally arranged integrated circuit packages, further complicating the manufacturing process. It is more difficult to test and thus determine the actual failure mode of the individual integrated circuits. Moreover, the substrate and integrated circuit are often damaged during assembly or testing, complicating the manufacturing process and increasing costs.

For both vertical and horizontal multi-chip packages, assembly of the multi-chip packages must have reliable electrical and mechanical attachments between the multiple integrated circuits, the stacked packaged integrated circuits, or a combination thereof. For example, the encapsulating process for forming the packaged integrated circuit may cause contamination, such as mold flash or bleed, impeding reliable attachments. Another example, for integrated circuit packages having a recess in the encapsulation, contoured mold chase are used to form the recess which increases the risk of mold flashes, damage to the package structure from contact with the contoured portion of the mold chase, and the manufacturing cost to design specific mold chase for the desired recess in the encapsulation.

Thus, a need still remains for an integrated circuit package system providing low cost manufacturing, improved yield, improved reliability, and greater flexibility to offer more functionality and fewer footprints on the printed circuit board. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: mounting a device structure over a package carrier; connecting an internal interconnect between the device structure and the package carrier; forming an interconnect lock over the internal interconnect over the device structure with interconnect lock exposing the device structure; and forming a package encapsulation adjacent to the interconnect lock and over the package carrier.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
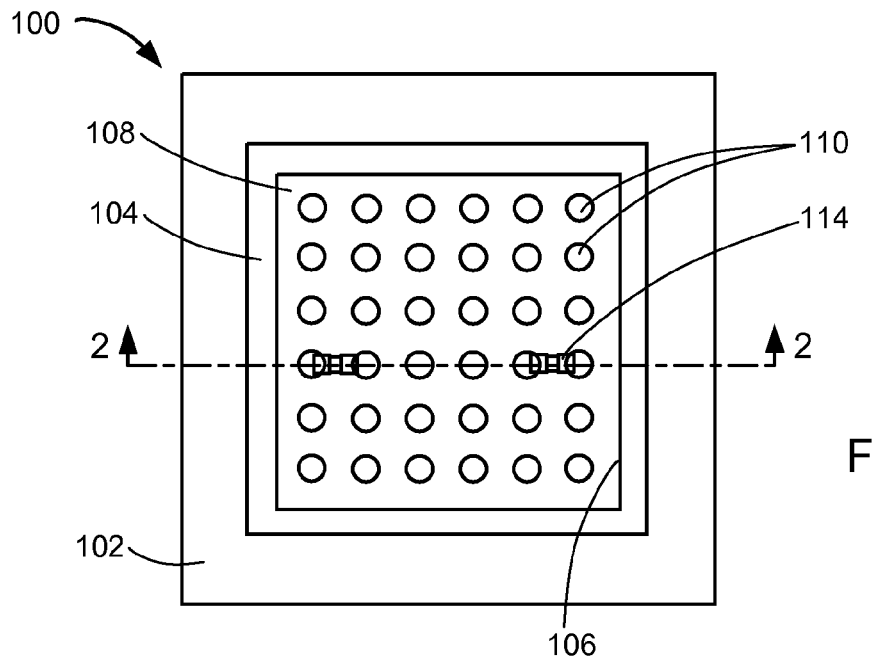
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit package system 100 in a first embodiment of the present invention. The integrated circuit package system 100 includes a package encapsulation 102, such as an epoxy molding compound, surrounding an interconnect lock 104. The interconnect lock 104 may be formed from with different materials and different structures. For example the interconnect lock 104 may be a non-conductive epoxy, an encapsulant in a configuration of a dam structure, a sealant, a polymeric material, a resin material, a wire-in-film adhesive, or other equivalent characteristic materials.

The interconnect lock 104 may form a recess 106 exposing a device structure 108, such as an interposer or a laminated substrate. Contact pads 110 of the device structure 108 are also shown exposed in the recess 106 formed by the interconnect lock 104 and the package encapsulation 102. Components 114, such as discrete passive components or an integrated circuit device, are shown mounted over the device structure 108.

Figure 2:
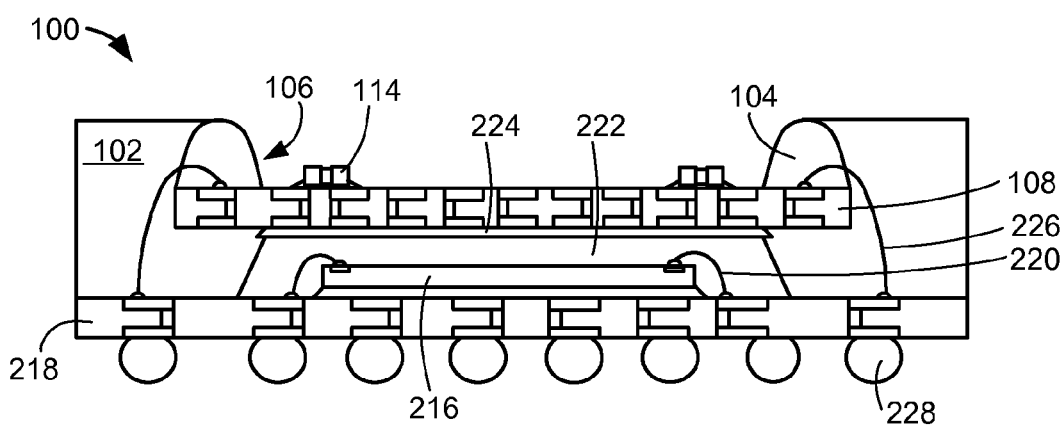
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The cross-sectional view depicts an integrated circuit die 216 mounted over a package carrier 218, such as a laminated substrate. First internal interconnects 220, such as bond wires or ribbon bond wires, connect the integrated circuit die 216 and the package carrier 218.

An inner encapsulation 222, such as an epoxy molding compound, covers the integrated circuit die 216 and the first internal interconnects 220 over the package carrier 218. The device structure 108 mounts over the inner encapsulation 222 with an adhesive 224, such as an adhesive film. Second internal interconnects 226, such as bond wires or ribbon bond wires, connect the device structure 108 and the package carrier 218.

The interconnect lock 104 covers a portion of the second internal interconnects 226 over the device structure 108. The interconnect lock 104 may be deposited over the device structure 108. The interconnect lock 104 may function to mitigate or eliminate wire sweep of the second internal interconnects 226 inadvertently creating shorts or breaking the mechanical connections of the second internal interconnects 226 with the device structure 108, the package carrier 218, or a combination thereof.

The interconnect lock 104 is not formed to follow the contour of the second internal interconnects 226 over the device structure 108. The interconnect lock 104 may be formed at the periphery of the device structure 108 covering the second internal interconnects 226 without requiring detailed location information of the second internal interconnects 226 allowing use of lower cost manufacturing equipments without require additional processing of the second internal interconnects 226 thereby reducing manufacturing steps, complexity, and cost.

It has been discovered that the present invention provides the integrated circuit package system having the interconnect lock with improved yield and lower cost manufacturing. The interconnect lock prevents or mitigates wire sweeps or connection breakage of the bond wires by holding the bond wires in place. This improves manufacturing yield. The application of the interconnect lock is around the peripheral portion of the interposer and the bond wires over the interposer without requiring precision locations of the bond wires or preprocessed bond wires having reinforcements. This reduces the manufacturing cost.

The package encapsulation 102 covers the second internal interconnects 226 and the inner encapsulation 222 over the package carrier 218. The package encapsulation 102 partially covers the interconnect lock 104 and the device structure 108 such that the recess 106 of the interconnect lock 104 exposes the device structure 108. The components 114 are shown mounted over the device structure 108. External interconnects 228, such as solder balls, may attach to and below the package carrier 218.

Figure 3:
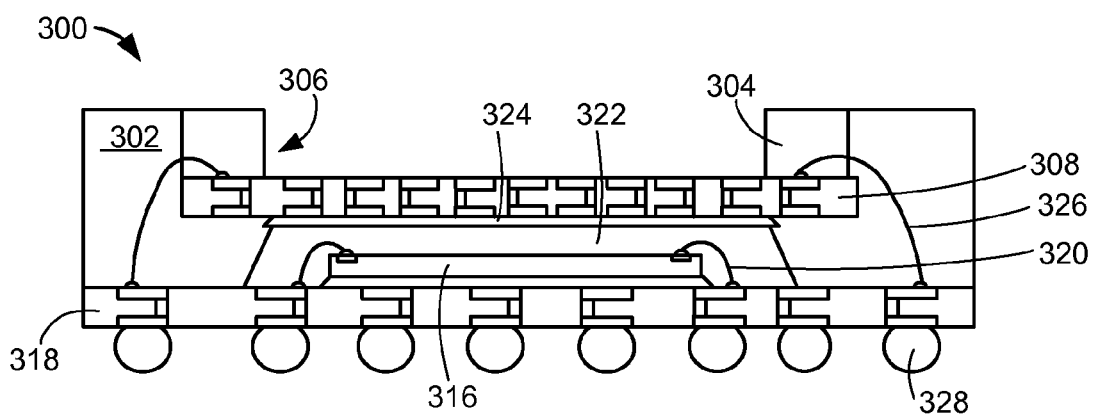
FIG. 3 is a cross-sectional view of an integrated circuit package system exemplified by the top view of FIG. 1 in a second embodiment of the present invention.

Referring now to FIG. 3, therein is a cross-sectional view of an integrated circuit package system 300 exemplified by the top view of FIG. 1 in a second embodiment of the present invention. The integrated circuit package system 300 includes structural similarities to the integrated circuit package system 100 of FIG. 2. The cross-sectional view depicts an integrated circuit die 316 mounted over a package carrier 318, such as a laminated substrate. First internal interconnects 320, such as bond wires or ribbon bond wires, connect the integrated circuit die 316 and the package carrier 318.

An inner encapsulation 322, such as an epoxy molding compound, covers the integrated circuit die 316 and the first internal interconnects 320 over the package carrier 318. A device structure 308, such as an interposer or a laminated substrate, mounts over the inner encapsulation 322 with an adhesive 324, such as an adhesive film. Second internal interconnects 326, such as bond wires or ribbon bond wires, connect the device structure 308 and the package carrier 318.

An interconnect lock 304, such as a wire-in-film, covers a portion of the second internal interconnects 326 over the device structure 308. The interconnect lock 304 may be deposited over the device structure 308. The interconnect lock 304 may be formed in a configuration of a dam structure. The interconnect lock 304 may function to mitigate or eliminate wire sweep of the second internal interconnects 326 inadvertently creating shorts or breaking the mechanical connections of the second internal interconnects 326 with the device structure 308, the package carrier 318, or a combination thereof.

The interconnect lock 304 is not formed to follow the contour of the second internal interconnects 326 over the device structure 308. The interconnect lock 304 may be formed at the periphery of the device structure 308 covering the second internal interconnects 326 without requiring detailed location information of the second internal interconnects 326 allowing use of lower cost manufacturing equipments without require additional processing of the second internal interconnects 326 thereby reducing manufacturing steps, complexity, and cost.

A package encapsulation 302 covers the second internal interconnects 326 and the inner encapsulation 322 over the package carrier 318. The package encapsulation 302 is preferably adjacent to the interconnect lock 304 and partially covers the device structure 308. A recess 306 of the interconnect lock 304 exposes the device structure 308. External interconnects 328, such as solder balls, may attach to and below the package carrier 318.

Figure 4:
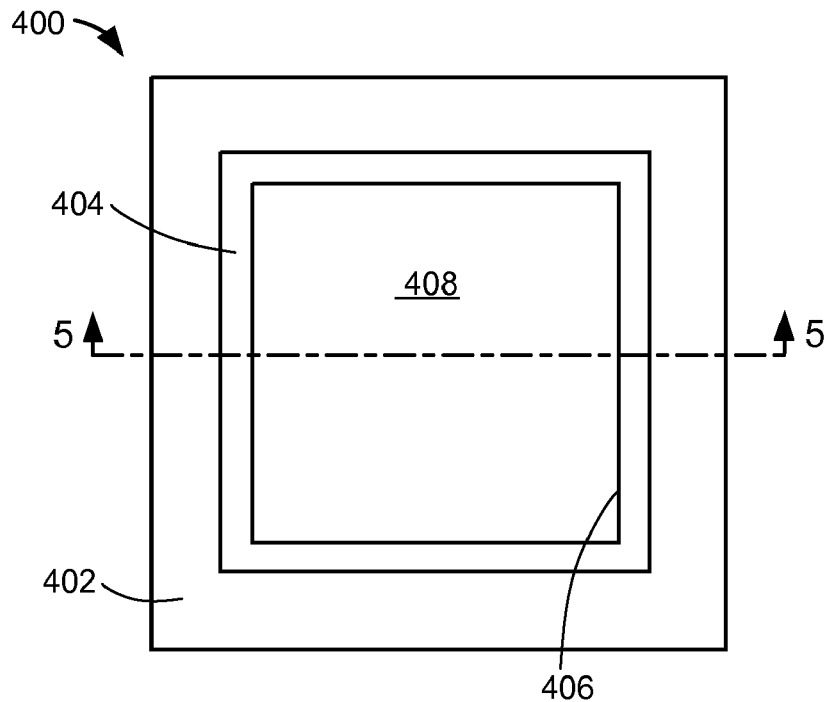
FIG. 4 is a top view of an integrated circuit package system in a third embodiment of the present invention.

Referring now to FIG. 4, therein is shown a top view of an integrated circuit package system 400 in a third embodiment of the present invention. The integrated circuit package system 400 includes a package encapsulation 402, such as an epoxy molding compound, surrounding an interconnect lock 404. The interconnect lock 404 may be formed from with different materials and different structures. For example the interconnect lock 404 may be a non-conductive epoxy, an encapsulant in a dam structure, a sealant, a polymeric material, a resin material, a wire-in-film adhesive, or other equivalent characteristic materials. The interconnect lock 404 may form a recess 406 exposing a device structure 408, such as an image or sensor integrated circuit.

Figure 5:
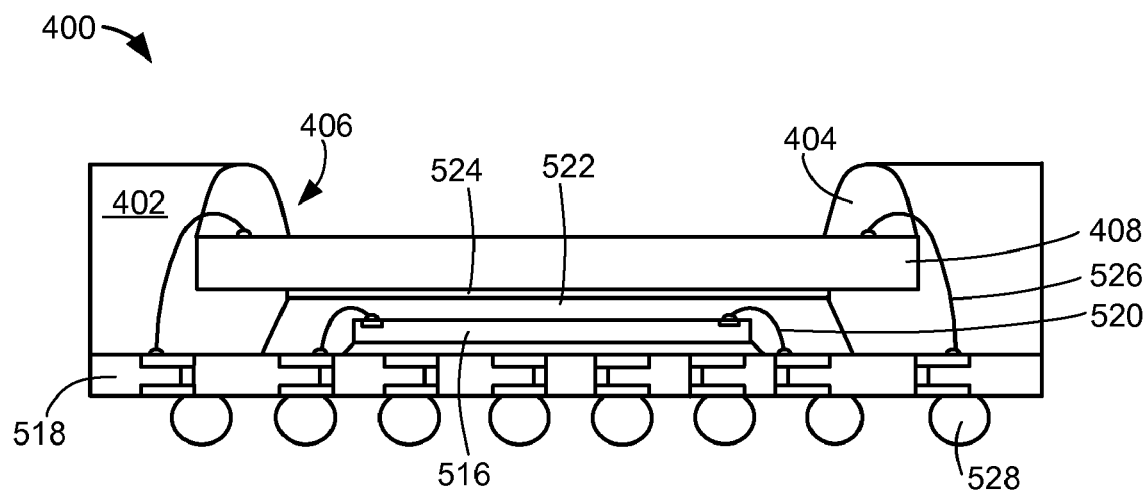
FIG. 5 is a cross-sectional view of the integrated circuit package system along line 5-5 of FIG. 4.

Referring now to FIG. 5, therein is shown a cross-sectional view of the integrated circuit package system 400 along line 5-5 of FIG. 4. The cross-sectional view depicts an integrated circuit die 516 mounted over a package carrier 518, such as a laminated substrate. First internal interconnects 520, such as bond wires or ribbon bond wires, connect the integrated circuit die 516 and the package carrier 518.

An inner encapsulation 522, such as an epoxy molding compound, covers the integrated circuit die 516 and the first internal interconnects 520 over the package carrier 518. The device structure 408 mounts over the inner encapsulation 522 with an adhesive 524, such as a die-attach adhesive or an adhesive film, in between. Second internal interconnects 526, such as bond wires or ribbon bond wires, connect the device structure 408 and the package carrier 518.

The interconnect lock 404 covers a portion of the second internal interconnects 526 over the device structure 408. The interconnect lock 404 may be deposited over the device structure 408. The interconnect lock 404 may function to mitigate or eliminate wire sweep of the second internal interconnects 526 inadvertently creating shorts or breaking the mechanical connections of the second internal interconnects 526 with the device structure 408, the package carrier 518, or a combination thereof.

The interconnect lock 404 is not formed to follow the contour of the second internal interconnects 526 over the device structure 408. The interconnect lock 404 may be formed at the periphery of the device structure 408 covering the second internal interconnects 526 without requiring detailed location information of the second internal interconnects 526 allowing use of lower cost manufacturing equipments without require additional processing of the second internal interconnects 526 thereby reducing manufacturing steps, complexity, and cost.

It has been discovered that the present invention provides the integrated circuit package system having the interconnect lock with improved yield and lower cost manufacturing. The interconnect lock protects the integrated circuit device from compression forces found typically with contoured mold chase to form the recess. This improves manufacturing yield and reduces the manufacturing cost.

The package encapsulation 402 covers the second internal interconnects 526 and the inner encapsulation 522 over the package carrier 518. The package encapsulation 402 partially covers the interconnect lock 404 and the device structure 408 such that the recess 406 of the interconnect lock 404 exposes the device structure 408. External interconnects 528, such as solder balls, may attach to and below the package carrier 518.

Figure 6:
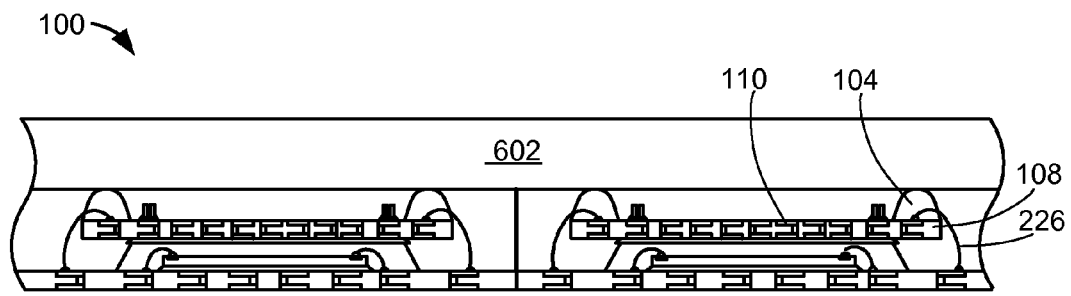
FIG. 6 is a cross-sectional view of the integrated circuit package system of FIG. 1 in a step for molding an intermediate structure.

Referring now to FIG. 6, therein is shown a cross-sectional view of the integrated circuit package system 100 of FIG. 1 in a step for molding an intermediate structure. The interconnect lock 104 allows using of fine wires for the second internal interconnects 226 without wire sweep. The interconnect lock 104 can serve as a dam to prevent mold flash contamination of the contact pads 110 of the device structure 108.

The interconnect lock 104 may cushion the clamping force from a mold chase 602 during molding process and thus prevents damage to the electrical layers of the device structure 108 or the device structure 408 of FIG. 5. The interconnect lock 104 also includes resilient properties to compensate for coplanarity errors due to package structure tilting during assembly process.

The ability to use the mold chase 602 of a flat panel-standard instead of having dedicated contoured or cavity-type mold chase improves productivity and lowers tooling cost. The mold chase 602 of the flat panel-standard also allows mounting of passive components and/or thin profile devices onto the device structure 108 prior to the molding process further simplifying the manufacturing process, increasing productivity, and reducing cost.

Figure 7:
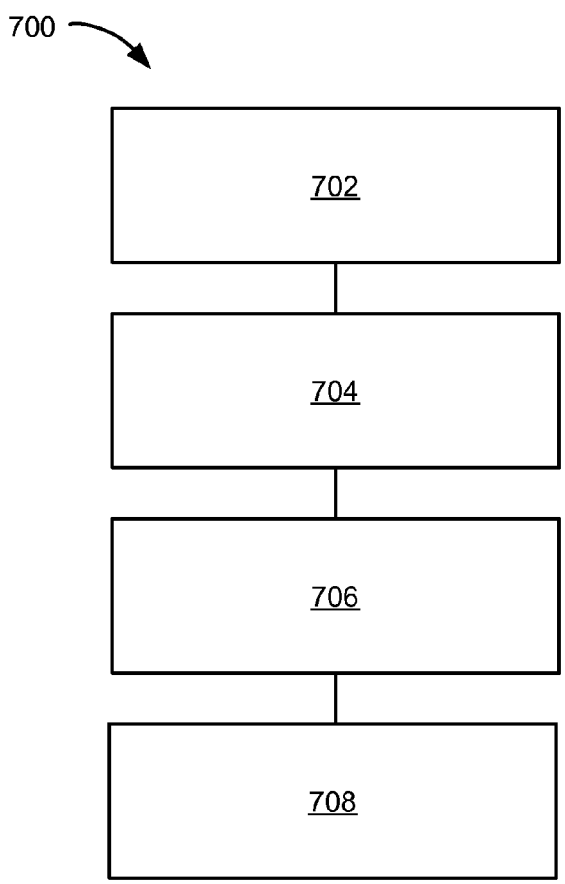
FIG. 7 is a flow chart of an integrated circuit package system for manufacturing of the integrated circuit package system in an embodiment of the present invention.

Referring now to FIG. 7, therein is shown a flow chart of an integrated circuit package system 700 for manufacturing the integrated circuit package system 100 in an embodiment of the present invention. The system 700 includes mounting a device structure over a package carrier in a block 702; connecting an internal interconnect between the device structure and the package carrier in a block 704; forming an interconnect lock over the internal interconnect over the device structure with interconnect lock exposing the device structure in a block 706; and forming a package encapsulation adjacent to the interconnect lock and over the package carrier in a block 708.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   mounting an integrated circuit die over a package carrier;
   mounting a device structure over the integrated circuit die;
   connecting an internal interconnect between the device structure and the package carrier;
   forming an interconnect lock only over a portion of the internal interconnect over a periphery of the device structure with the interconnect lock exposing the device structure; and
   forming a package encapsulation surrounding the interconnect lock and over the package carrier.

2. The method as claimed in claim 1 wherein mounting the device structure includes mounting an interposer.

3. The method as claimed in claim 1 wherein mounting the device structure includes mounting the device structure over the integrated circuit device with an adhesive in between.

4. The method as claimed in claim 1 further comprising:
   forming an inner encapsulation over the integrated circuit die; and
   wherein mounting the device structure over the integrated circuit die includes:
   mounting the device structure over the inner encapsulation.

5. The method as claimed in claim 1 further comprising mounting a component over the device structure without the package encapsulation.

6. A method for manufacturing an integrated circuit package system comprising:
   mounting an integrated circuit die over a package carrier;
   mounting a device structure over the integrated circuit die;
   connecting a bond wire between the device structure and the package carrier;
   forming an interconnect lock only over a portion of the internal interconnect over a periphery of the device structure with the interconnect lock exposing the device structure;
   forming a package encapsulation surrounding the interconnect lock and over the package carrier; and
   mounting a component over the device structure without the package encapsulation.

7. The method as claimed in claim 6 wherein forming the interconnect lock includes forming the interconnect lock in a configuration of a dam structure.

8. The method as claimed in claim 6 wherein forming the package encapsulation includes exposing the device structure.

9. The method as claimed in claim 6 wherein forming the interconnect lock on the bond wire includes depositing the interconnect lock not contoured to the bond wire.

10. The method as claimed in claim 6 further comprising attaching an external interconnect to and below the package carrier.

11. An integrated circuit package system comprising:
    a package carrier;
    an integrated circuit die over the package carrier;
    a device structure over the integrated circuit;
    an interconnect lock only over a portion of the internal interconnect over a periphery of the device structure with the interconnect lock exposing the device structure; and
    an interconnect lock over the internal interconnect over the device structure with the interconnect lock exposing the device structure; and
    a package encapsulation surrounding the interconnect lock and over the package carrier.

12. The system as claimed in claim 11 wherein the device structure includes an interposer.

13. The system as claimed in claim 11 further comprising an adhesive between the device structure and the integrated circuit device.

14. The system as claimed in claim 11 further comprising:
    an inner encapsulation over the integrated circuit die; and
    wherein the device structure over the package carrier includes:
    the device structure over the inner encapsulation.

15. The system as claimed in claim 11 further comprising a component over the device structure.

16. The system as claimed in claim 11 further comprising:
    an integrated circuit die over the package carrier;
    a component over the device structure; and
    wherein:
    the device structure over the package carrier includes:
    the device structure over the integrated circuit die; and
    the internal interconnect includes:
    a bond wire.

17. The system as claimed in claim 16 wherein the interconnect lock includes a dam structure.

18. The system as claimed in claim 16 wherein the package encapsulation exposes the device structure.

19. The system as claimed in claim 16 wherein the interconnect lock over the bond wire includes the interconnect lock not contoured to the bond wire.

20. The system as claimed in claim 16 further comprising an external interconnect attached to and below the package carrier.

* * * * *

UNITED STATES PATENT AND TRADEMARK OFFICE
CERTIFICATE OF CORRECTION

PATENT NO. : 7,985,628 B2
APPLICATION NO. : 11/954607
DATED : July 26, 2011
INVENTOR(S) : Kuan et al.

Page 1 of 1

It is certified that error appears in the above-identified patent and that said Letters Patent is hereby corrected as shown below:

In the Claims

Column 8:

claim 11, after line 24 and before line 25, insert:
--an internal interconnect between the device structure and the package carrier;-- claim 11, lines 29-31, delete:
"an interconnect lock over the internal interconnect over the
device structure with the interconnect lock exposing the
device structure; and"

Signed and Sealed this
Second Day of July, 2013

Teresa Stanek Rea
*Acting Director of the United States Patent and Trademark Office*